(12) United States Patent
Bae et al.

(10) Patent No.: US 8,828,543 B2
(45) Date of Patent: *Sep. 9, 2014

(54) CONDUCTIVE PARTICLES COMPRISING COMPLEX METAL LAYER WITH DENSITY GRADIENT, METHOD FOR PREPARING THE PARTICLES, AND ANISOTROPIC CONDUCTIVE ADHESIVE COMPOSITION COMPRISING THE PARTICLES

(75) Inventors: Tae Sub Bae, Suwon-si (KR); Jin Gyu Park, Seoul (KR); Jung Bae Jun, Gunpo-si (KR); Jae Ho Lee, Yongin-si (KR); Jung Il Park, Incheon-si (KR); Sang Woon Lee, Seoul (KR)

(73) Assignee: Cheil Industries Inc., Gumi-si (KR)

( * ) Notice: Subject to any disclaimer, the term of this patent is extended or adjusted under 35 U.S.C. 154(b) by 1095 days.

This patent is subject to a terminal disclaimer.

(21) Appl. No.: 11/966,040

(22) Filed: Dec. 28, 2007

(65) Prior Publication Data

US 2008/0102277 A1    May 1, 2008

Related U.S. Application Data

(63) Continuation-in-part of application No. PCT/KR2005/002557, filed on Aug. 5, 2005.

(30) Foreign Application Priority Data

Jul. 5, 2005    (KR) ........................ 10-2005-0060225

(51) Int. Cl.
*B32B 5/16*    (2006.01)
*B05D 3/04*    (2006.01)
*H05K 3/32*    (2006.01)

(52) U.S. Cl.
CPC ........ *H05K 3/323* (2013.01); *H05K 2201/0221* (2013.01); *H05K 2201/0233* (2013.01)

USPC ............ 428/403; 428/323; 428/407; 427/212

(58) Field of Classification Search
USPC ......................................................... 428/402
See application file for complete search history.

(56) References Cited

U.S. PATENT DOCUMENTS 4,790,551 A    12/1988    Ukai et al.
5,162,087 A *  11/1992    Fukuzawa et al. ............ 252/500

(Continued)

FOREIGN PATENT DOCUMENTS

EP    1426979 A1    6/2004
JP    59-102953 A    6/1984

(Continued)

OTHER PUBLICATIONS

International Search Report for corresponding International Application No. PCT/KR2005/002557, mailed on Apr. 7, 2006.

(Continued)

*Primary Examiner* — Alicia Chevalier
*Assistant Examiner* — Alexandre Ferre
(74) *Attorney, Agent, or Firm* — Additon, Higgins & Pendleton, P.A.

(57) ABSTRACT

Disclosed herein are anisotropic conductive particles having superior electrical reliability which are useful as materials for electrical connection structures. Further disclosed is a method for preparing conductive particles comprising polymer resin base particles and a conductive complex metal plating layer formed on the surface of the base particles wherein the conductive complex metal plating layer has a substantially continuous density gradient and can include nickel (Ni) and gold (Au).

25 Claims, 4 Drawing Sheets

(56) References Cited

U.S. PATENT DOCUMENTS

| | | | |
|---|---|---|---|
| 5,486,941 A | 1/1996 | Saiuchi et al. | |
| 5,580,838 A | 12/1996 | Patterson | |
| 6,344,156 B1 | 2/2002 | Yamada et al. | |
| 6,352,775 B1 * | 3/2002 | Sasaki et al. | 428/403 |
| 6,398,856 B1 * | 6/2002 | Nakazawa | 106/1.26 |
| 6,770,369 B1 | 8/2004 | Oyamada et al. | |
| 7,291,393 B2 | 11/2007 | Wakiya et al. | |
| 7,338,710 B2 | 3/2008 | Kamiya et al. | |
| 7,851,063 B2 | 12/2010 | Jun et al. | |
| 2001/0046021 A1 | 11/2001 | Kozuka et al. | |
| 2003/0162047 A1 * | 8/2003 | Appelt et al. | 428/570 |
| 2003/0178313 A1 * | 9/2003 | Tanaka et al. | 205/74 |
| 2004/0140572 A1 * | 7/2004 | Yamate et al. | 257/778 |
| 2006/0263581 A1 | 11/2006 | Park et al. | |
| 2007/0145585 A1 | 6/2007 | Jun et al. | |
| 2008/0078977 A1 * | 4/2008 | Hashiba et al. | 252/500 |

FOREIGN PATENT DOCUMENTS

| | | |
|---|---|---|
| JP | 62-177082 | 8/1987 |
| JP | 63-107188 A | 5/1988 |
| JP | 02-024358 | 1/1990 |
| JP | 02-118079 A | 5/1990 |
| JP | 04-333025 A | 11/1992 |
| JP | 05-33147 A | 2/1993 |
| JP | 07-118617 | 5/1995 |
| JP | 07-118866 | 5/1995 |
| JP | 07-256231 A | 10/1995 |
| JP | 2507381 | 4/1996 |
| JP | 08-113654 A | 5/1996 |
| JP | 08113654 A * | 5/1996 |
| JP | 08-311655 A | 11/1996 |
| JP | 08-325543 | 12/1996 |
| JP | 09-185069 A | 7/1997 |
| JP | 10-101962 A | 4/1998 |
| JP | 11-125953 A | 5/1999 |
| JP | 11-329060 | 11/1999 |
| JP | 2000-243132 | 9/2000 |
| JP | 2000-243132 A | 9/2000 |
| JP | 2003-26813 | 1/2003 |
| JP | 2003-064500 A | 3/2003 |
| JP | 2003-068143 A | 3/2003 |
| JP | 2003-197028 | 7/2003 |
| JP | 2003-253231 | 9/2003 |
| JP | 2003-257247 | 9/2003 |
| JP | 2003-313304 A | 11/2003 |
| KR | 10-2005-0043639 | 5/2005 |
| WO | 92-06402 A | 12/1992 |

OTHER PUBLICATIONS

Office Action in commonly owned U.S. Appl. No. 11/500,018 mailed May 5, 2008, pp. 1-11.
Final Office Action in commonly owned U.S. Appl. No. 11/500,018 mailed Nov. 6, 2008, pp. 1-9.
Advisory Action in commonly owned U.S. Appl. No. 11/500,018 mailed Feb. 2, 2009, pp. 1-3.
Office Action in commonly owned U.S. Appl. No. 11/500,018 mailed May 13, 2009, pp. 1-8.
Final Office Action in commonly owned U.S. Appl. No. 11/500,018 mailed Dec. 9, 2009, pp. 1-10.
Advisory Action in commonly owned U.S. Appl. No. 11/500,018 mailed Mar. 23, 2010, pp. 1-3.
Office Action in commonly owned U.S. Appl. No. 11/500,018 mailed Nov. 23, 2010, pp. 1-8.
Final Office Action in commonly owned U.S. Appl. No. 11/500,018 mailed May 12, 2011, pp. 1-11.
Notice of Allowance in commonly owned U.S. Appl. No. 11/500,018 mailed Sep. 22, 2011, pp. 1-7.
J. G. Park, et al. "Monodisperse polymer/metal composite particles by electroless chemical deposition: Effect of surface functionality of polymer particles", Journal of Applied Polymer Science, vol. 87, pp. 420-424, Jan. 18, 2003.
International Search Report in commonly owned International Application No. PCT/KR2005/002005, mailed on Sep. 26, 2005, pp. 1-2.
International Search Report in commonly owned International Application No. PCT/KR2005/001558 dated Oct. 25, 2005, pp. 1-4.
English Translation of Abstract for Japanese Patent Application No. S63-107188, pp. 1, (1988).
Office Action in commonly owned U.S. Appl. No. 11/763,521 mailed Dec. 22, 2010, pp. 1-14.
Final Office Action in commonly owned U.S. Appl. No. 11/763,521 mailed Jun. 9, 2011, pp. 1-12.
Advisory Action in commonly owned U.S. Appl. No. 11/763,521 mailed Aug. 22, 2011, pp. 1-3.
Notice of Allowance in commonly owned U.S. Appl. No. 11/828,559 mailed Aug. 5, 2010, pp. 1-10.
Office Action in commonly owned U.S. Appl. No. 11/828,559 mailed Nov. 16, 2009, pp. 1-8.
Advisory Action in commonly owned U.S. Appl. No. 11/828,559 mailed Jun. 26, 2009, pp. 1-5.
Final Office Action in commonly owned U.S. Appl. No. 11/828,559 mailed Feb. 26, 2009.
Office Action in commonly owned U.S. Appl. No. 11/828,559 mailed Sep. 4, 2008, pp. 1-8.

* cited by examiner

CONDUCTIVE PARTICLES COMPRISING COMPLEX METAL LAYER WITH DENSITY GRADIENT, METHOD FOR PREPARING THE PARTICLES, AND ANISOTROPIC CONDUCTIVE ADHESIVE COMPOSITION COMPRISING THE PARTICLES

CROSS-REFERENCE TO RELATED APPLICATIONS

This non-provisional application is a continuation-in-part application of PCT Application No. PCT/KR2005/002557, filed Aug. 5, 2005, pending, which designates the U.S. and which is hereby incorporated by reference in its entirety, and from Korean Patent Application No. 10-2005-0060225, filed Jul. 5, 2005, which is also hereby incorporated by reference in its entirety.

FIELD OF THE INVENTION

The present invention relates to anisotropic conductive particles and methods for preparing conductive particles.

BACKGROUND OF THE INVENTION

Conductive resin materials and plastic materials are currently used for electrical connection between minute sites of electronic devices, e.g., between ITO electrodes and driving LSIs, between LSI chips and circuit boards, and between micro-pattern electrode terminals in liquid crystal display (LCD) panels. In particular, anisotropic conductive films are used to ensure electrical contact between electrodes and reliable connection. As pitch intervals have recently become narrower in conductive films, conductivity, adhesiveness, dispersability and content of conductive particles capable of imparting anisotropic conductivity to the conductive films have gained importance.

For example, resin/metal complex particles useful as conductive particles are prepared by forming a thin metal layer on Ni particles, Ni/Au complex particles or plastic particles as base particles, depending on the particular application of anisotropic conductive films.

Electroless plating has been employed to prepare conductive resin/metal complex particles comprising plastic particles. Generally, conductive resin/metal complex particles are prepared by pretreatments, e.g., defatting, etching, sensitizing, catalyzing, treating with a reducing agent, etc., of base particles or powder, followed by electroless plating (Japanese Patent No. 2507381; Japanese Patent Publication No. 1994-096771; and Japanese Patent Laid-open Nos. 1990-024358, 2000-243132, 2003-064500, and 2003-068143). At this time, the electrical/physiochemical properties of the final particles vary according to the kind and number of metals to be introduced. Ni/Au double complex metal layers are commonly applied to anisotropic conductive films (Japanese Patent Laid-open Nos. 1999-329060 and 2000-243132).

The reason why Ni/Au consecutive metal layers are commonly employed among metal-plated particles using plastic base particles is that Ni can easily be formed into form a thin metal layer by electroless plating, Au can be plated on the surface of the plated Ni by substitution plating, and Au shows stable electrical connection properties at connection sites of semiconductors and other mounting devices due to its superior conductivity.

Japanese Patent Laid-open No. 2000-243132 discloses the formation of a Ni/Au complex plating layer by forming a substantially indiscrete Ni layer on plastic base particles by electroless plating, and forming an Au layer on the Ni layer by substitution plating. The expression "substantially indiscrete Ni layer" as used herein refers to a plating layer having a thickness of 5 nm or more formed by deposition of fine Ni particles during plating when observed under a scanning electron microscope (SEM) at a magnification of 5,000× to 10,000×. The formation of the substantially indiscrete Ni layer is indispensable for the introduction of an Au layer. Taking the plating adhesion to the base particles into consideration, in actuality, a Ni layer having a thickness of from about 50 nm to 70 nm has commonly been introduced.

However, when conductive particles comprising a Ni plating layer within the thickness range defined above are interposed between electrodes and compressively deformed by 10% or more, peeling takes place between the plastic particles and the Ni layer. When the compressive deformation is continued above 10% or more, the peeling phenomenon leads to the rupture of the Ni layer, resulting in poor electrical connection of an anisotropic conductive film. The causes of the peeling phenomenon are that the Ni layer has a relatively high hardness and a relatively low elastic modulus, compared to the plastic particles. Thus, there is a need for a Ni—Au complex conductive layer having superior adhesion to plastic particles and superior electrical properties while maintaining the thickness of a Ni layer at a minimum level.

SUMMARY OF THE INVENTION

In accordance with one aspect of the present invention, there are provided conductive particles comprising polymer resin base particles and a conductive complex metal plating layer including at least two metals formed on the surface of the base particles, for example by electroless plating, wherein the conductive complex metal plating layer has a substantially continuous density gradient extending outwardly from a surface of the base particles.

The conductive complex metal plating layer can include two or three metals selected from Ni, Ni—P, Ni—B, Au, Ag, Ti, and Cu.

The conductive complex metal plating layer with a substantially continuous density gradient can have a thickness of from about 0.01 µm to about 1 µm.

The base particles can have an average particle diameter of about 1 µm to about 1,000 µm and a particle diameter distribution within about 90 to about 110% of the average particle diameter.

The conductive complex metal plating layer with a substantially continuous density gradient can have a thickness variation within the range of about 0.01 to about 50% of the average thickness of the base particles.

The polymer particles can be prepared by homo- or copolymerization of at least one crosslinkable monomer selected from: allyl compounds, including divinylbenzene, 1,4-divinyloxybutane, divinylsulfone, diallyl phthalate, diallylacrylamide, triallyl (iso)cyanurate, and triallyl trimellitate; (poly)alkylene glycol di(meth)acrylate, including (poly)ethylene glycol di(meth)acrylate, and (poly)propylene glycol di(meth)acrylate; and pentaerythritol tetra(meth)acrylate, pentaerythritol tri(meth)acrylate, pentaerythritol di(meth)acrylate, trimethylolpropane tri(meth)acrylate, dipentaerythritol hexa(meth)acrylate, dipentaerythritol penta(meth)acrylate, and glycerol tri(meth)acrylate. Alternatively, the polymer particles can be prepared by copolymerization of the crosslinkable monomer and an acrylic- or styrene-based monomer. The conductive particles of the present invention are characterized in that the polymer particles are made of a radical-polymerizable polymer.

The conductive particles of the present invention can offer several benefits and advantages. The polymer base particles of the conductive particles of the invention can have a uniform size. In addition, the conductive complex metal plating layer, such as a Ni—Au complex metal plating layer, can have a density gradient so as to achieve superior adhesion to the surface of polymer particles. Further, the conductive particles of the present invention can have high conductivity and can have a readily controlled thickness.

In accordance with another aspect of the present invention, there is provided a method for preparing conductive particles wherein the conductive particles comprise polymer resin base particles and a conductive complex metal plating layer comprising at least two metals formed on the surface of the base particles by electroless plating. In exemplary embodiments of the invention, the method comprises dispersing the polymer particles in an electroless nickel plating solution, and continuously feeding an electroless gold plating solution to the electroless nickel plating solution during formation of a Ni plating layer to form a complex metal layer on the polymer particles by electroless continuous plating.

In accordance with another aspect of the present invention, there is provided an anisotropic conductive adhesive composition comprising the conductive particles.

In accordance with yet another aspect of the present invention, there is provided an anisotropic conductive film comprising the conductive particles wherein the conductive particles are contained in an amount of about 1,000 to about 100,000 count/mm$^2$ in the conductive film. The conductive particles of the anisotropic conductive film of the invention can include a complex metal plating layer and polymer resin base particles, in which the conductive complex metal plating layer can have superior adhesion to the surface of the polymer particles and superior conductivity.

For the conductive particles having substantially continuous Ni and Au density gradients of the present invention, since the thickness of a hard Ni layer is minimized and a relatively soft Au region and the Ni layer coexist along a certain thickness of the conductive complex metal plating layer, the flexibility and adhesion of the metal plating layer are maintained and at the same time deterioration in electrical connection by rupture can be prevented. In addition, since the conductive particles of the present invention comprise a thinner metal layer than conventional conductive particles, the specific gravity of the final conductive particles can be advantageously lowered, leading to an increase in the number of the conductive particles per unit weight when dispersed in an anisotropic conductive adhesive.

Furthermore, since filtering after nickel plating in the metal plating process can be omitted, the productivity is improved and loss of metals to be introduced is avoided, thus contributing to cost reduction. Moreover, since peeling of the plating metals and damage to compactness of the plating metals caused due to friction during filtering can be prevented, good conductivity is maintained even after compression for connection, resulting in improved quality of anisotropic conductive films.

DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
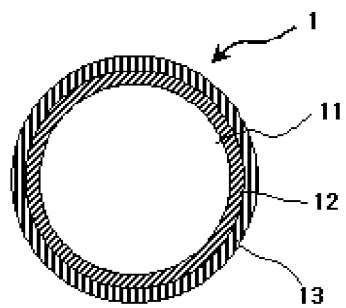
FIG. 1 is a cross-sectional view of a conventional conductive particle comprising a Ni—Au discrete complex layer formed on resin base particles by electroless plating.

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The conductive particles of the present invention include a complex metal plating layer, such as a Ni—Au metal complex plating layer, which can be formed on polymer base particles by electroless continuous complex plating. The outermost portion of the conductive particles is composed of one of the metals of the complex metal plating layer, such as Au. In exemplary embodiments, the conductive particles of the invention can include a Ni—Au metal complex plating layer having substantially continuous Ni and Au density gradients extending from the surface of the base particles to an outermost portion of the plating layer in a vertical direction. Accordingly, the complex plating layer of the conductive particles according to the present invention shows improved adhesion to the base particles and enables formation of a highly conductive layer, when compared to a Ni layer of conventional conductive particles prepared by electroless Ni—Au double plating. In addition, since a soft Au region and a hard Ni region coexist in the conductive particles of the present invention, rupture of the conductive thin metal layer can be considerably avoided under any pressure, unlike Ni—Au discrete complex double plating layers of conventional conductive particles.

The term "adhesion" as used herein refers to a degree of peeling caused between the base particles and the metal layer after compressive deformation of the conductive particles. This adhesion can be confirmed by observing the cross section of the conductive particles interposed between electrodes after connection of the anisotropic conductive film.

The thin complex metal layer having a substantially continuous density gradient formed by electroless continuous complex plating is not limited to the Ni—Au layer. Examples of metals that can be formed into a plating layer by electroless plating include Ni, Ni—P, Ni—B, Au, Ag, Ti, Co, Nb, Cu, and mixtures thereof. The thin complex metal layer can include two or three metals. However, the use of catalytically poisoning metals, such as Bi, Sb, As, Cd, Zn, Mn and Pb, is unfavorable.

By the continuous complex plating employed in the present invention, uniform thickness and compact plating can be achieved in the plating process by which the metal layer is formed on the polymer particles to impart conductivity to the conductive particles. As a result, the conductivity of the conductive particles can be maintained constant. Electroless Ni metal plating and electroless Au plating are simultaneously performed so that uniform thickness and compact plating in the plating process are achieved, thus allowing the Ni and Au plating layers to form an indiscrete complex plating layer with a density gradient. In addition, the outermost portion of the conductive particles is composed of the Au plating layer in order to impart high conductivity to the conductive particles. Consequently, the conductive particles of the present invention show superior electrical properties and superior adhesion between layers.

The indiscrete complex plating layer formed by electroless plating may have a thickness ranging from about 0.005 μm to about 10 μm. The thickness of the indiscrete complex plating layer can be in the range of from about 0.01 μm to about 1 μm for applications in which the size of particles required for connection of electrodes having narrow pitch intervals is between about 1 μm and about 10 μm. In addition, the thickness uniformity of the plating layer should not greatly detract from the monodispersity inherent to the conductive particles. The indiscrete complex plating layer formed on the entire surface of the base particles can have an average thickness variation of about 0.01 to about 50%. When the average thickness variation exceeds about 50%, the uniformity of the conductive particles is lowered, making it difficult to attain uniform connection of electrodes inside the anisotropic conductive film.

Figure 2:
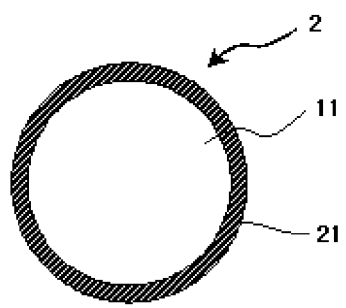
FIG. 2 is a cross-sectional view of a conductive particle prepared by electroless plating according to the present invention.

FIG. 1 shows the cross section of a conventional conductive particle 1, and FIG. 2 shows the cross section of a conductive particle according to the present invention. The preparation of the conventional conductive particle 1 is performed through the following three steps: first step—pretreatments, such as defatting, etching, sensitizing, catalyzing, treating with a reducing agent, etc., of the surface of a polymer particle 11; second step—electroless nickel (Ni) plating and washing; and third step—gold (Au) substitution plating. Since the third step (i.e., gold substitution plating) is carried out after the nickel plating, the conventional conductive particle has discrete double plating layers consisting of a Ni layer 12 and an Au layer 13, as shown in FIG. 1.

FIG. 2 is a cross-sectional view of a conductive particle 2 according to the present invention. The present invention is directed to improvement of poor adhesion and poor electrical communication resulting from rupture of a discrete plating layer consisting of a Ni layer 12 and an Au layer 13 by compression, which are problems of the conventional conductive particle 1. To this end, separate Ni electroless plating (second step) and Au electroless plating (third step) are simplified into one electroless continuous plating, enabling formation of a metal conductive Ni—Au complex plating layer 21 with a continuous density gradient on a base particle 11.

The electroless continuous plating process will now be described in more detail. First, polymer particles having an average particle diameter of about 1 to about 1,000 μm and a particle diameter distribution within about 90 to about 110% of the average particle diameter are selected as base particles. The polymer particles are dipped in a surfactant solution having a proper concentration to wash and defat the surface of the polymer particles. Thereafter, etching is performed using a mixed solution of chromic acid and sulfuric acid to form anchors on the surface of the polymer particles. The surface-treated polymer particles are dipped in a solution of tin chloride and palladium chloride to catalyze and activate the surface of the polymer particles. As a result, fine nuclei of the palladium catalyst are formed on the surface of the polymer particles. Subsequently, a reduction reaction is carried out using sodium hypophosphite, sodium borohydride, dimethyl amine borane, hydrazine, and the like, to form uniform palladium nuclei on the polymer particles. After the resulting polymer particles are dispersed in an electroless nickel plating solution, an electroless gold plating solution having a given concentration is continuously fed to the dispersion during formation of a plating layer to induce a gold substitution plating reaction, thereby forming a Ni—Au indiscrete complex plating layer having a density gradient. Even after reduction of Ni in the Ni plating solution is completed, the Au plating solution having a given concentration is continuously added to form a plated plating layer having an outermost portion composed of Au.

Since the thickness of the hard Ni layer is minimized and the relatively soft Au region and the Ni layer coexist for a certain thickness of the conductive complex metal plating layer 21, the flexibility and adhesion of the metal plating layer are maintained and at the same time deterioration in electrical connection by rupture can be prevented. In addition, since the conductive particles of the present invention comprise a thinner metal layer than the conventional conductive particles, the specific gravity of the final conductive particles can be advantageously lowered, leading to an increase in the number of the conductive particles per unit weight when dispersed in an anisotropic conductive adhesive.

The polymer base particles used to prepare the conductive particles of the present invention are made of a radical-polymerizable polymer. Specifically, the polymer particles can be prepared by homo- or copolymerization of at least one crosslinkable monomer selected from: allyl compounds, including divinylbenzene, 1,4-divinyloxybutane, divinylsulfone, diallyl phthalate, diallylacrylamide, triallyl (iso)cyanurate, and triallyl trimellitate; (poly)alkylene glycol di(meth) acrylate, including (poly)ethylene glycol di(meth)acrylate, and (poly)propylene glycol di(meth)acrylate; and pentaerythritol tetra(meth)acrylate, pentaerythritol tri(meth) acrylate, pentaerythritol di(meth)acrylate, trimethylolpropane tri(meth)acrylate, dipentaerythritol hexa(meth)acrylate, dipentaerythritol penta(meth)acrylate, and glycerol tri(meth) acrylate, and mixtures thereof. Alternatively, the polymer particles can be prepared by copolymerization of the crosslinkable monomer and an acrylic- or styrene-based monomer.

Figure 3:
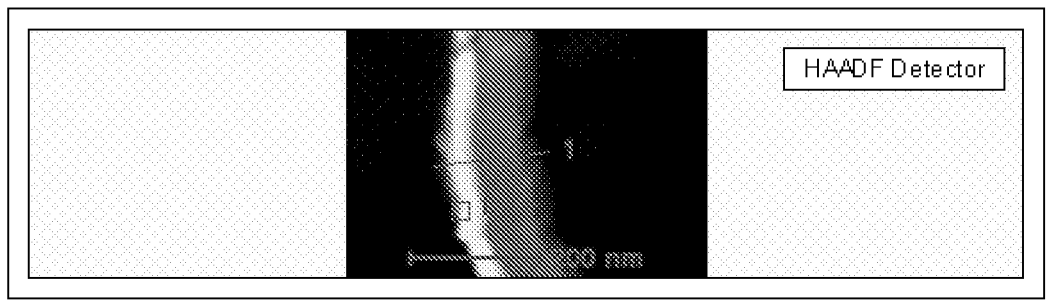
FIG. 3 is a transmission electron micrograph (TEM) taken after a conventional conductive particle comprising a Ni—Au discrete complex layer is cut in a vertical direction.
Figure 4:
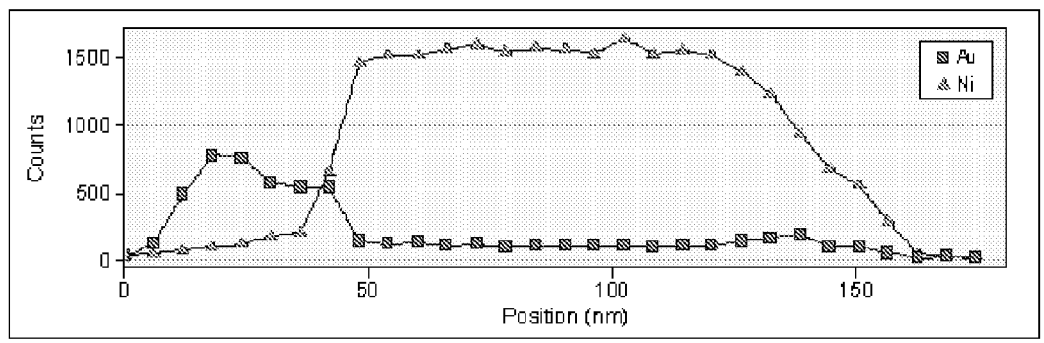
FIG. 4 is a graph showing the analytical results of Ni and Au density gradients by energy dispersive microscopy (EDS) after a conventional conductive particle comprising a Ni—Au discrete complex layer is cut in a vertical direction.

FIG. 3 is a transmission electron micrograph (TEM) of the metal plating layer of the conventional conductive particle 1, and FIG. 4 shows the profiling results from the outermost portion of the particle 1 in the density of the Ni layer 12 and the Au layer 13 according to the thickness, as analyzed by energy dispersive microscopy (EDS). As is evident from FIGS. 3 and 4, the Ni—Au complex plating layer has a thickness of about 150 nm, the Ni layer 12 has a thickness of about 100 nm, and the Au layer 13 has a thickness of about 50 nm, which indicates that the composition of the Ni layer steeply changes from a distance of about 100 nm from the base particle.

Figure 5:
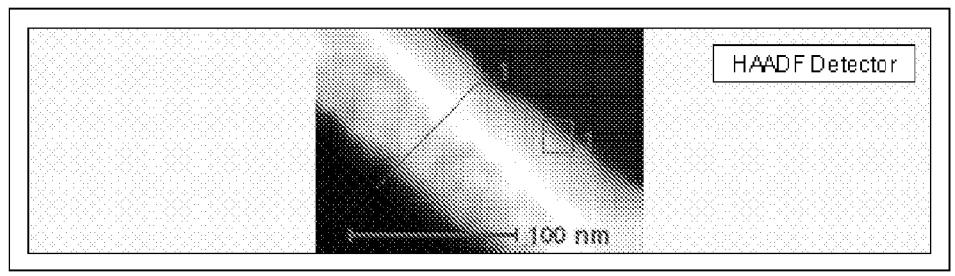
FIG. 5 is a transmission electron micrograph (TEM) taken after a conductive particle prepared by electroless plating according to the present invention is cut in a vertical direction.
Figure 6:
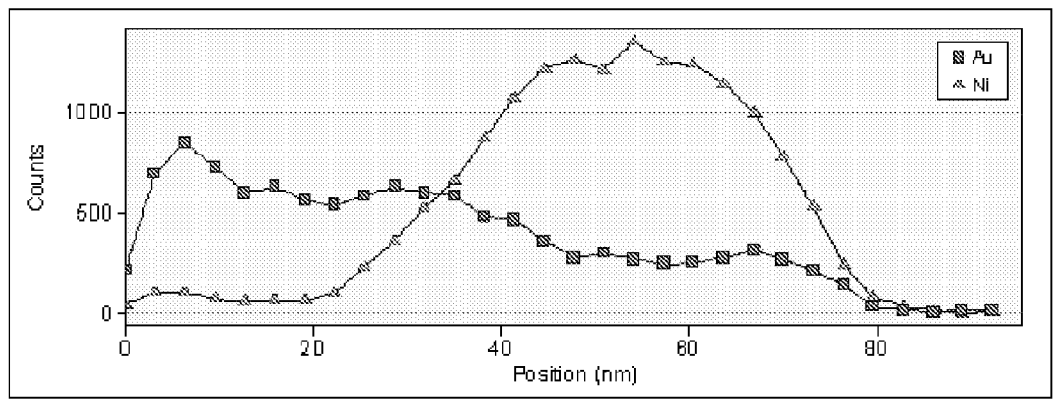
FIG. 6 is a graph showing the analytical results of Ni and Au density gradients by energy dispersive microscopy (EDS) after a conductive particle prepared by electroless plating according to one embodiment of the present invention is cut in a vertical direction.

FIG. 5 is a transmission electron micrograph (TEM) of the metal plating layer of the conductive particle 2 according to the present invention, and FIG. 6 shows the profiling results from the outermost portion of the particle 2 in the density of the metal plating layer 21 according to the thickness, as analyzed by energy dispersive microscopy (EDS). As is evident from FIGS. 5 and 6, the Ni—Au complex plating layer 21 has a thickness of about 80 nm, the outermost portion of the conductive particle is composed of Au only, like the conductive particle 1, and the conductive particle has a substantially continuous density gradient through the depth of the plating layer 21. As used herein, a "substantially continuous density gradient" refers to a gradient including at least two metals, such as Ni and Au discussed herein, extending from the surface of the base particle and extending outwardly to an outermost portion of the plating layer. Particularly, Au is distributed substantially throughout the entire thickness of the metal plating layer of the conductive particle shown in FIG. 6, unlike the conventional conductive particle shown in FIG. 4. The coexistence of Ni and Au in the metal layer improves the flexibility of the thin conductive metal layer, thus markedly lowering the rupture probability of the metal layer after compressive deformation of the conductive particle.

Figure 7:
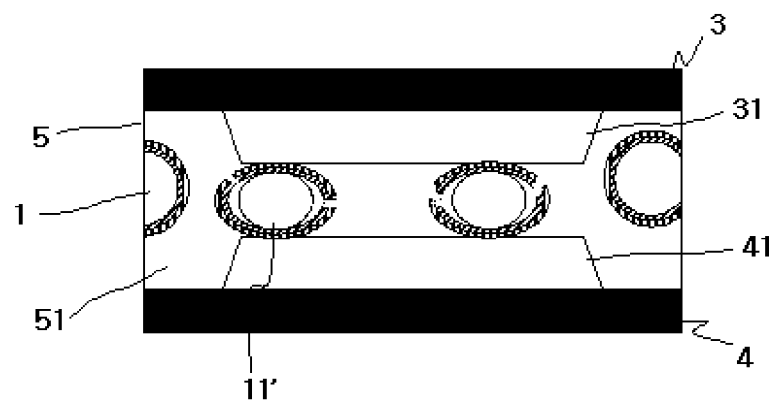
FIG. 7 is a cross-sectional view showing a poor connection state due to peeling between a Ni layer and polymer base particles caused after conventional conductive particles are applied to an anisotropic conductive film and interposed between electrodes.

FIG. 7 is a cross-sectional view showing a cause of increased connection resistance resulting from the rupture of the thin double metal layers when the conventional conductive particles are dispersed in an anisotropic conductive film and interposed between an electrode of a driving integrated circuit 3 and an electrode of a glass substrate 4. As explained earlier, since the hard Ni region in the conventional conductive particles has a thickness of about 100 nm or more, rupture takes place due to a difference in the flexibility between the base particles and the Ni region after heating/compression of the anisotropic conductive film, leading to the rupture of the entire metal layers. This rupture causes an increase in the connection resistance of the anisotropic conductive film.

Figure 8:
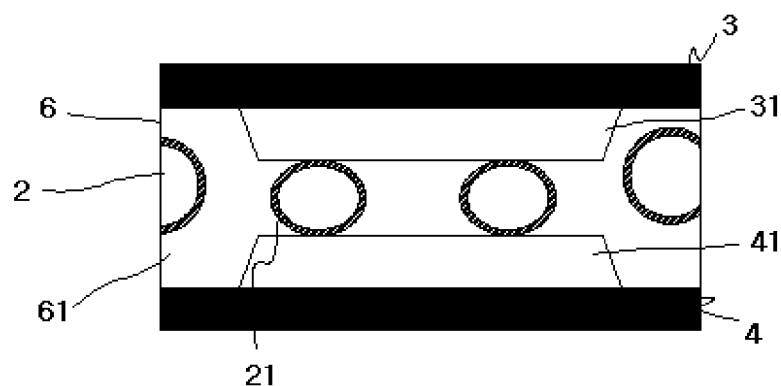
FIG. 8 is a cross-sectional view showing a stable connection state caused after conductive particles of the present invention are applied to an anisotropic conductive film and interposed between electrodes.

FIG. 8 is a cross-sectional view showing a state wherein the conductive particles of the present invention are dispersed in an anisotropic conductive film and interposed between an electrode of a driving integrated circuit 3 and an electrode of a glass substrate 4. As described above, since the relatively soft Au region and the Ni region coexist in the conductive particles of the present invention by continuous complex plating, rupture of the metal layer can be effectively prevented. In addition, since the conductive particles of the present invention (FIG. 6) have an outermost portion composed of Au, like the conventional conductive particles (FIG. 4), the conductive particles of the present invention show superior electrical connection properties. Since the thickness of the final thin metal layer of the conductive particles according to the present invention is about one half of that of the metal layers of the conventional conductive particles, the conductive particles of the present invention have a lower specific gravity. Accordingly, when the conductive particles of the present invention are dispersed in the same amount as the conventional conductive particles in an anisotropic conductive adhesive film, the number of the dispersed conductive particles of the present invention per unit area is about two times more than that of the conventional conductive particles, increasing the final connection resistance reliability of the adhesive film.

Figure 9:
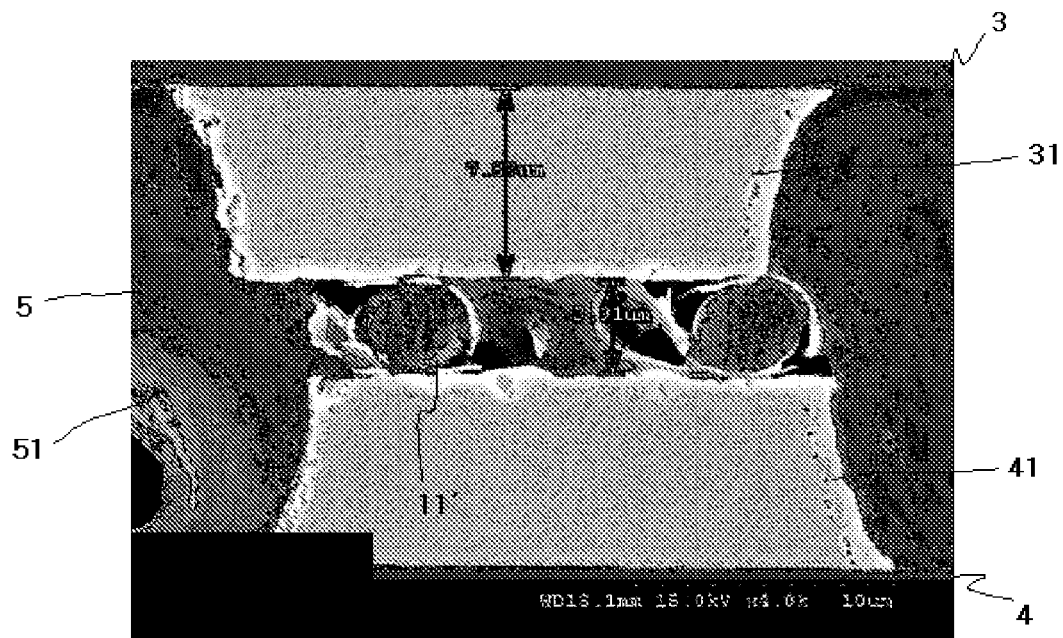
FIG. 9 is a scanning electron micrograph (SEM) showing a poor connection state due to peeling between a Ni layer and polymer base particles caused after conventional conductive particles are applied to an anisotropic conductive film and interposed between electrodes.

FIG. 9 is a scanning electron micrograph (SEM) showing a connection state of an anisotropic conductive film comprising the conventional conductive particles. As described above, it can be confirmed from the micrograph that the Ni and Au metal layers are ruptured.

Figure 10:
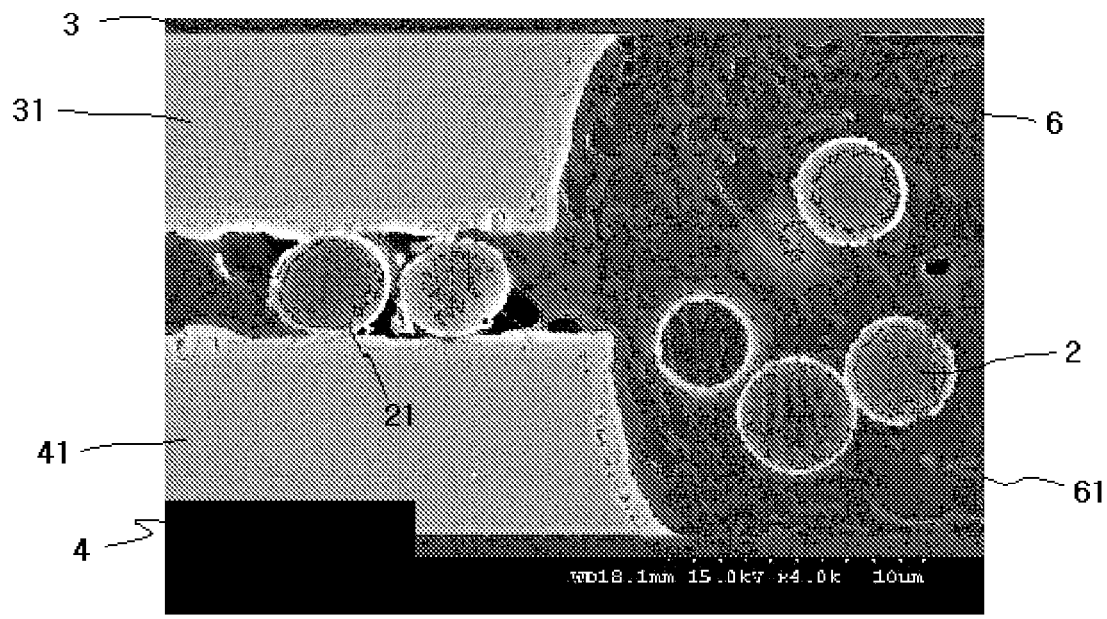
FIG. 10 is a scanning electron micrograph (SEM) showing a stable connection state caused after conductive particles of the present invention are applied to an anisotropic conductive film and interposed between electrodes.

FIG. 10 is a scanning electron micrograph (SEM) showing a connection state of an anisotropic conductive film comprising the conductive particles of the present invention. As described above, it can be confirmed from the micrograph that the thin metal layer is highly stable even after connection, unlike the metal layers of the conventional conductive particles.

In accordance with another aspect of the present invention, there is provided an anisotropic conductive adhesive composition comprising the conductive particles including a complex metal layer.

The anisotropic conductive adhesive composition comprises the conductive particles and at least one film-forming material selected from crosslinkable oligomers, prepolymers, monomers and mixtures thereof.

The film-forming material, e.g., an oligomer, prepolymer or monomer, can be a material suitable for the formation of a film, without involving a chemical reaction with a curing agent contained in the composition at room temperature. Specific examples of the material include: acrylic resins, including acrylate resins, ethylene-acrylate copolymers, and ethylene-acrylic acid copolymers; olefinic resins, including ethylene resins, and ethylene-propylene copolymers; rubbers, including butadiene resins, acrylonitrile-butadiene copolymers, styrene-butadiene block copolymers, styrene-butadiene-styrene block copolymers, carboxylated styrene-ethylene-butadiene-styrene block copolymers, ethylene-styrene-butylene block copolymers, nitrile-butadiene rubbers, styrene-butadiene rubbers, and chloroprene rubbers; vinyl resins, including vinylbutyral resins, and vinyl formal resins; ester resins, including polyesters, and cyanate ester resins; phenoxy resins; silicone rubbers; and urethane resins. These materials can be used alone or in combination. The film-forming polymers can be used to prepare epoxy curable, acrylic curable, and epoxy/acrylic mixed curable compositions.

The content of the conductive particles in the anisotropic conductive adhesive composition can be between about 1 wt % and about 50 wt %, for example between about 1.5 wt % and about 25 wt %, based on the total weight of the anisotropic conductive adhesive. When the content of the conductive particles is less than about 1 wt %, conduction paths cannot be stably formed. On the other hand, when the content of the conductive particles exceeds about 50 wt %, it is difficult to attain high insulation reliability between connection circuits. The resin base particles of the conductive particles can have a thermal decomposition temperature of about 200 to about 500° C.

In accordance with yet another aspect of the present invention, there is provided an anisotropic conductive film comprising about 1,000 to about 100,000 count/$mm^2$ of the conductive particles including a complex metal layer. The polymer contained in the anisotropic conductive film of the present invention can be a polyepoxide polymer having at least two epoxy groups per molecule. Specific examples of the polyepoxide polymer include novolac resins, including phenol novolac and cresol novolac; polyhydric phenols, including bisphenol A, bisphenol F and bishydroxyphenyl ether; polyhydric alcohols, including ethylene glycol, neopentyl glycol, glycerin, trimethylolpropane, and polypropylene glycol; polyamino compounds, including ethylenediamine, triethylenetetraamine, and aniline; and polycarboxyl compounds, including phthalic acid and isophthalic acid. These polymers can be used alone or in combination.

The content of the conductive particles in the anisotropic conductive film of the present invention can be about 1,000 to about 100,000 count/mm$^2$, for example about 5,000 to about 60,000 count/mm$^2$.

Hereinafter, the present invention will be specifically described with reference to the following examples. These examples are made only for illustrative purposes, and the present invention is not to be construed as being limited to these examples.

Examples 1 to 4

(1) Selection of Particles

Polydivinylbenzene (PDVB) polymer particles are selected as base particles. Each of the polymer particles has a CV value of 4.5% and an average particle size (8.9 μm, 5.2 μm, 4.1 μm and 3.7 μm) indicated in Table 1 below.

TABLE 1

| Example No. | Particle size of polymer (μm) |
|---|---|
| Example 1 | 8.9 |
| Example 2 | 5.2 |
| Example 3 | 4.1 |
| Example 4 | 3.7 |

(2) Pretreatments 20 g of each of the PDVB particles is dipped in a 2% surfactant solution for 10 minutes to defat the surface of the PDVB particles. The surfactant solution can be readily prepared by processes well known to those skilled in the art. Thereafter, the defatted PDVB particles are etched by dipping the particles in a mixed solution containing 10 g/L chromic acid and 400 g/L sulfuric acid for 10 minutes to form anchors on the PDVB particles, dipped in an aqueous tin (II) chloride solution (1 g/L) for 3 minutes, filtered, and washed to catalyze and activate the surface of the polymer particles. The collected polymer particles are dipped in an aqueous palladium chloride solution (0.1 g/L) for 3 minutes, filtered, and washed. Subsequently, the washed polymer particles are dipped in a 10% hydrochloric solution, followed by reduction, to form fine palladium nuclei on the surface of the polymer particles.

(3) Electroless Plating

The catalyzed base particles are stirred at varying speeds to prevent the formation of non-uniform plating arising from aggregation, adhesion and precipitation of the particles during plating. 20.0 g of the pretreated base particles are placed in a plating bath and sufficiently dispersed in a stirring solution containing a complexing agent. Then, an electroless nickel plating solution is added to the plating bath to form a nickel plating layer on the base particles. The nickel electroless plating solution contains nickel sulfate, sodium hypophosphite and potassium hydroxide in an equivalent ratio of 1:1:2, as indicated in Table 2 below. During formation of the nickel plating layer, an electroless gold plating solution is fed into the plating bath to form a Ni—Au indiscrete complex plating layer having a density gradient. At this time, the gold plating is preferably performed while maintaining the plating conditions at pH 5.5 and 70° C.

The electroless gold plating solution includes gold potassium cyanide (KAu(CN)$_2$) as a gold (Au) precursor, potassium cyanide (KCN), potassium hydroxide (KOH), and potassium carbonate (K$_2$CO$_3$). The gold plating solution can be readily prepared by processes well known to those skilled in the art. After the electroless gold plating, the complex plating layer is washed and filtered to obtain conductive particles comprising the Ni—Au indiscrete complex plating layer with a density gradient, sufficiently washed with alcohol, and dried under vacuum. Scanning electron microscopy (SEM) confirms that the plating layer formed by electroless plating is indiscrete and has superior surface roughness.

TABLE 2

| Composition of nickel electroless plating solution | Equivalent ratio |
|---|---|
| 1. Nickel sulfate | 1 |
| 2. Sodium hypophosphite | 1 |
| 3. Potassium hydroxide | 2 |

(4) Evaluation of Physical Properties

The thickness of the plating layer is measured by transmission electron microscopy (TEM). The conductivity of one conductive particle after compression is evaluated by measuring a resistance value after compression of the conductive particle to 10% of its initial size using a micro-compression tester (Model: MCT 501, manufactured by Shimadzu Corporation Ltd., Japan). The thickness and conductivity of the Ni—Au indiscrete complex plating layers formed in Examples 1 to 4 having a density gradient are measured, and the results are shown in Table 3 below.

Comparative Examples 1 and 2

(1) Selection of Particles

Polydivinylbenzene (PDVB) polymer particles are selected as base particles. Each of the polymer particles has a CV value of 4.5% and an average particle size of 8.9 μm (Comparative Example 1) and 5.2 μm (Comparative Example 2).

(2) Electroless Plating

Pretreatments are performed in the same manner as in Examples 1 to 4. Thereafter, common electroless Ni plating is performed, and then the nickel-plated base particles are washed and subjected to electroless Au plating to form a Au plating layer on the nickel plating layer. The physical properties of the plating layer are measured, and the obtained results are shown in Table 3 below.

TABLE 3

| | | After Ni—Au plating | |
|---|---|---|---|
| Example No. | Average particle diameter of base particles (μm) | Average thickness of plating layer (nm) | Conductivity (Ω) |
| Ex. 1 | 8.9 | 115 | 6.5 |
| Ex. 2 | 5.2 | 90 | 7.8 |
| Ex. 3 | 4.1 | 80 | 4.5 |
| Ex. 4 | 3.7 | 135 | 5.3 |
| Comp. Ex. 1 | 8.9 | 200 | 11.2 |
| Comp. Ex. 2 | 5.2 | 185 | 15.3 |

Note: The conductivity (Ω) of the conductive particles is obtained by measuring resistance values of 10 particles per sample after compression, and averaging the measured values.

As can be seen from the data shown in Table 3, the conductive particles prepared in Examples 1 to 4 show superior conductivity as compared to those prepared in Comparative Examples 1 and 2. In addition, the conductive particles prepared in Examples 1 to 4 have a uniform thickness and show good plating properties and superior adhesion between the plating layers.

Examples 5 to 10

(1) Production of Anisotropic Conductive Films

In Examples 5 to 10, anisotropic conductive films are produced using conductive particles having a continuous density gradient of Ni and Au, in accordance with the following procedure.

15 parts by weight of a bisphenol A epoxy resin having an epoxy equivalent of 6,000 and 7 parts by weight of 2-methylimidazole as a curing agent are dissolved in a mixed solvent of toluene and methyl ethyl ketone, after which 2 to 15 wt % of conductive particles and a silane-based coupling agent are dispersed in the solution. The conductive particles are prepared in the same manner as in Example 1, except that the content and size are changed to those indicated in Table 4 below. The resulting dispersion is coated on a PET release film, and dried to produce a 25 μm thick anisotropic conductive adhesive film.

An anisotropic conductive film is produced from the anisotropic conductive adhesive film so as to have the following dimensions. Height of bump electrodes: 40 μm, IC chip size: 6 mm×6 mm, thickness of BT resin substrate: 0.7 mm, thickness of wiring patterns formed on the substrate by copper and gold plating: 8 μm, pitch: 150 μm. The anisotropic conductive film is interposed between the IC chip and the substrate, and then pressurized at 400 kg/cm² while heating at 200° C. for 20 seconds to connect circuits. After the connection sample is aged at 80° C. and 85% RH for 1,000 hours, the electrical connection and electrical connection reliability of the IC chips are evaluated as an increment in resistance.

Comparative Examples 3 to 5

Anisotropic conductive films comprising conventional conductive particles are produced and evaluated for electrical connection and insulation reliability. The results are shown in Table 4 below.

As can be seen from the data shown in Table 4, the anisotropic conductive films comprising conductive particles having a density gradient of Ni and Au according to the present invention show better electrical connection reliability than the anisotropic conductive films produced comprising the conventional conductive particles.

The conductive particles of the present invention are expected to be useful as materials for anisotropic conductive products with high electrical connection reliability for connection of electrode terminals having narrow pitches.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

That which is claimed is:

1. A conductive particle comprising:
a polymer resin base particle; and
a conductive complex metal plating single layer comprising at least two metals formed by simultaneous electroless plating of said at least two metals on the surface of the base particle, wherein the conductive complex metal plating single layer comprises:
a first density gradient including one of the at least two metals and extending from the surface of the base particle toward an outer portion of the conductive complex metal plating single layer, wherein the concentration of said one of the at least two metals continuously increases in a direction extending vertically away from the surface of the base particle; and
a second density gradient including the other of the at least two metals and also extending from the surface of the base particle toward an outer portion of the conductive complex metal plating single layer, wherein the concentration of the other of the at least two metals initially increases and then decreases in a direction extending vertically away from the surface of the base particle,
wherein the concentration of both of the metals increases along at least a portion of the complex metal plating single layer.

2. The conductive particle according to claim 1, wherein the conductive complex metal plating layer comprises two or three metals selected from Ni, Ni—P, Ni—B, Au, Ag, Ti, and Cu.

TABLE 4

|  | Ex. 5 | Ex. 6 | Ex. 7 | Ex. 8 | Ex. 9 | Ex. 10 | Comp. Ex. 3 | Comp. Ex. 4 | Comp. Ex. 5 |
|---|---|---|---|---|---|---|---|---|---|
| Content of conductive particles (count/mm²) | 10,000 | 30,000 | 30,000 | 40,000 | 40,000 | 50,000 | 30,000 | 40,000 | 30,000 |
| Size of conductive particles (μm) | 3.9 | 4.3 | 5.4 | 4.3 | 5.4 | 4.3 | 4.3 | 4.3 | 5.4 |
| Area of IC bump used for evaluation of electrical connection reliability (μm²) | 3,000 | 3,000 | 3,000 | 3,000 | 3,000 | 3,000 | 3,000 | 3,000 | 3,000 |
| Connection resistance after mounting | 0.7 | 0.5 | 0.6 | 0.4 | 0.5 | 0.4 | 0.8 | 0.8 | 0.9 |
| Electrical connection reliability | □ | □ | □ | □ | □ | □ | □ | □ | □ |

□: increment in resistance ≤ 0.1 Ω, □: 0.1 Ω < Increment in resistance < 0.3 Ω, x: increment in resistance > 0.3 Ω

3. The conductive particle according to claim 1, wherein the conductive complex metal plating layer has a thickness of from about 0.01 μm to about 1 μm.

4. The conductive particle according to claim 1, wherein the base particle has an average particle diameter of about 1 μm to about 1,000 μm and a particle diameter distribution within about 90 to about 110% of the average particle diameter.

5. The conductive particle according to claim 1, wherein the conductive complex metal plating layer has a thickness variation within the range of about 0.01 to about 50% of the average thickness of the base particle.

6. The conductive particle according to claim 1, wherein the polymer particle is a radical-polymerizable polymer prepared by homo- or copolymerization of at least one crosslinkable monomer selected from the group consisting of allyl compounds; (poly)alkylene glycol di(meth)acrylates; pentaerythritol compounds; trimethylolpropane tri(meth)acrylate; glycerol tri(meth)acrylate; mixtures thereof with one another; and mixtures thereof with an acrylic- or styrene-based monomer.

7. The conductive particle according to claim 6, wherein said allyl compound comprises a compound selected from the group consisting of divinylbenzene, 1,4-divinyloxybutane, divinylsulfone, diallyl phthalate, diallylacrylamide, triallyl (iso)cyanurate, and triallyl trimellitate; said (poly)alkylene glycol di(meth)acrylate comprises a compound selected from the group consisting of (poly)ethylene glycol di(meth)acrylate and (poly)propylene glycol di(meth)acrylate; and said pentaerythritol compound comprises a compound selected from the group consisting of pentaerythritol tetra(meth)acrylate, pentaerythritol tri(meth)acrylate, pentaerythritol di(meth)acrylate, dipentaerythritol hexa(meth)acrylate, and dipentaerythritol penta(meth)acrylate.

8. The conductive particle according to claim 6, wherein the polymer resin base particle consists of an allyl compound; (poly)alkylene glycol di(meth)acrylate; pentaerythritol compound; trimethylolpropane tri(meth)acrylate; glycerol tri (meth)acrylate; or a mixture thereof with one another.

9. The conductive particle according to claim 8, wherein the polymer resin base particle consists of an allyl compound or a mixture of allyl compounds.

10. The conductive particle according to claim 9, wherein the polymer resin base particle consists of divinylbenzene.

11. The conductive particle according to claim 1, wherein the complex metal plating layer comprises Ni and Au density gradients.

12. The conductive particle according to claim 11, wherein the complex metal plating layer comprises Au along an outermost surface thereof.

13. The conductive particle according to claim 11, in which the concentration of Au in the Au density gradient increases in a direction extending vertically away from a surface of the base particle and in which the concentration of Ni in the Ni density gradient decreases in a direction extending vertically away from a surface of the base particle.

14. The conductive particle according to claim 1, wherein the simultaneous electroless plating of the at least two metals comprises dispersing the polymer resin base particle in a first electroless plating solution including a first metal and continuously feeding a second electroless plating solution including a second metal to the dispersion of the base particle and the first electroless plating solution during formation of a plating layer to form the conductive complex metal plating single layer on the base particle.

15. An anisotropic conductive adhesive composition comprising conductive particles comprising a polymer resin base particle and a conductive complex metal plating single layer comprising at least two metals formed by simultaneous electroless plating of said at least two metals on the surface of the base particle, wherein the conductive complex metal plating single layer comprises:
   a first density gradient including one of the at least two metals and extending from the surface of the base particle toward an outer portion of the conductive complex metal plating single layer, wherein the concentration of said one of the at least two metals continuously increases in a direction extending vertically away from the surface of the base particle; and
   a second density gradient including the other of the at least two metals and also extending from the surface of the base particle toward an outer portion of the conductive complex metal plating single layer, wherein the concentration of the other of the at least two metals initially increases and then decreases in a direction extending vertically away from the surface of the base particle,
   wherein the concentration of both of the metals increases along at least a portion of the complex metal plating single layer.

16. The anisotropic conductive adhesive composition according to claim 15, wherein the conductive complex metal plating layer comprises two or three metals selected from Ni, Ni—P, Ni—B, Au, Ag, Ti, and Cu.

17. The anisotropic conductive adhesive composition according to claim 16, wherein the complex metal plating layer comprises Ni and Au density gradients.

18. The anisotropic conductive adhesive composition according to claim 17, wherein the complex metal plating layer comprises Au along an outermost surface thereof.

19. An anisotropic conductive film comprising conductive particles comprising a polymer resin base particle and a conductive complex metal plating single layer comprising at least two metals formed by simultaneous electroless plating of said at least two metals on the surface of the base particle, wherein the conductive complex metal plating single layer comprises:
   a first density gradient including one of the at least two metals and extending from the surface of the base particle toward an outer portion of the conductive complex metal plating single layer, wherein the concentration of said one of the at least two metals continuously increases in a direction extending vertically away from the surface of the base particle; and
   a second density gradient including the other of the at least two metals and also extending from the surface of the base particle toward an outer portion of the conductive complex metal plating single layer, wherein the concentration of the other of the at least two metals initially increases and then decreases in a direction extending vertically away from the surface of the base particle,
   wherein the concentration of both of the metals increases along at least a portion of the complex metal plating single layer, and
   wherein the conductive particles are contained in an amount of about 1,000 to about 100,000 count/mm$^2$ in the conductive film.

20. The anisotropic conductive film according to claim 19, wherein the conductive complex metal plating layer comprises two or three metals selected from Ni, Ni—P, Ni—B, Au, Ag, Ti, and Cu.

21. The anisotropic conductive film according to claim 20, wherein the complex metal plating layer comprises Ni and Au density gradients.

22. The anisotropic conductive film according to claim 21, wherein the complex metal plating layer comprises Au along an outermost surface thereof.

23. A method for preparing conductive particles according to claim 1, comprising polymer resin base particles and a conductive complex metal plating layer comprising at least two metals formed on the surface of the base particles by electroless plating, the method comprising:
- dispersing the polymer particles in a first electroless metal plating solution comprising a first metal; and
- continuously feeding a second electroless metal plating solution comprising a second metal that is different from the first metal to the first electroless metal plating solution to form a complex metal layer comprising both of the first and second metals on the polymer particles.

24. The method according to claim 23, wherein the continuously feeding step comprises continuously feeding the second electroless metal plating solution to the first electroless metal plating solution to form a complex metal layer comprising substantially continuous density gradients of the first and second metals.

25. A method for preparing conductive particles according to claim 1, comprising polymer resin base particles and a conductive complex metal plating layer comprising at least two metals formed on the surface of the base particles by electroless plating, the method comprising:
- dispersing the polymer particles in an electroless nickel plating solution, and
- continuously feeding an electroless gold plating solution to the electroless nickel plating solution during formation of a Ni plating layer to form a complex metal layer on the polymer particles by electroless continuous plating.

* * * * *